United States Patent
Conte et al.

(10) Patent No.: US 8,704,588 B2
(45) Date of Patent: Apr. 22, 2014

(54) CIRCUIT FOR GENERATING A REFERENCE VOLTAGE

(75) Inventors: Antonino Conte, Trimestieri Etneo (IT); Mario Micciche, Agrigento (IT); Rosario Roberto Grasso, Acicastello (IT); Maria Giaquinta, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 34 days.

(21) Appl. No.: 12/913,658

(22) Filed: Oct. 27, 2010

(65) Prior Publication Data

US 2011/0102058 A1    May 5, 2011

(30) Foreign Application Priority Data

Oct. 30, 2009 (IT) .................. MI2009A1898

(51) Int. Cl.
 *G05F 1/567* (2006.01)
 *G05F 1/575* (2006.01)
 *H03L 5/00* (2006.01)

(52) U.S. Cl.
 USPC ............ 327/539; 327/541; 323/313; 323/316

(58) Field of Classification Search
 None
 See application file for complete search history.

(56) References Cited

U.S. PATENT DOCUMENTS

| | | | |
|---|---|---|---|
| 4,883,987 A | 11/1989 | Fattaruso | |
| 6,275,098 B1 | 8/2001 | Uehara et al. | |
| 6,529,066 B1 | 3/2003 | Guenot et al. | |
| 6,853,238 B1 * | 2/2005 | Dempsey et al. | 327/539 |
| 7,084,698 B2 * | 8/2006 | Khan et al. | 327/539 |
| 7,113,025 B2 * | 9/2006 | Washburn | 327/539 |
| 7,164,260 B2 * | 1/2007 | Neaves | 323/316 |
| 7,342,390 B2 * | 3/2008 | Tachibana et al. | 323/316 |
| 7,777,558 B2 * | 8/2010 | Chen | 327/539 |
| 7,839,202 B2 | 11/2010 | Sengupta et al. | |
| 7,961,041 B2 | 6/2011 | Motz | |

(Continued)

FOREIGN PATENT DOCUMENTS

| | | |
|---|---|---|
| EP | 0638996 | 2/1995 |
| WO | 95/30271 | 11/1995 |
| WO | 98/42072 | 9/1998 |

OTHER PUBLICATIONS

Search Report based on Italian Application Serial No. MI20091897, Ministero dello Sviluppo Economico, Jun. 18, 2010, pp. 4.

(Continued)

*Primary Examiner* — Lincoln Donovan
*Assistant Examiner* — Terry L Englund
(74) *Attorney, Agent, or Firm* — Graybeal Jackson LLP

(57) ABSTRACT

A bandgap voltage reference circuit for generating a bandgap voltage reference. An embodiment comprises a current generator controlled by a first driving voltage for generating a first current depending on the driving voltage, and a first reference circuit element coupled to the controlled current generator for receiving the first current and generating a first reference voltage in response to the first current. The circuit further comprises a second reference circuit element for receiving a second current corresponding to the first current; said second reference circuit element is adapted to generate a second reference voltage in response to the second current. The circuit further comprises an operational amplifier having a first input coupled to the first circuit element and a second input coupled to the second reference circuit element. The circuit also comprises a control circuit comprising first capacitive element and second capacitive element.

48 Claims, 5 Drawing Sheets

(56) References Cited

U.S. PATENT DOCUMENTS

| | | | |
|---|---|---|---|
| 8,031,001 B2 | 10/2011 | Ide | |
| 8,058,863 B2 * | 11/2011 | Cho et al. | 323/316 |
| 2006/0043957 A1 * | 3/2006 | Carvalho | 323/313 |
| 2011/0102049 A1 | 5/2011 | Conte et al. | |

OTHER PUBLICATIONS

Amer Hani Atrash and Arlo Aude: "A Bandgap reference circuit utilizing switching to reduce offsets and a novel technique for leakage current compensation" Circuits and Systems, 2004. NEWCAS 2004. The 2nd Annual IEEE Northeast Workshop on Montreal, Canada Jun. 20-23, 2004, pp. 297-300, XP010742514.

Christian C Enz et al: "Circuit Techniques for Reducing the Effects of Op-Amp Imperfections: Autozeroing, Correlated Double Sampling, and Chopper Stabilization" Proceedings of the IEEE, IEEE. New York, US, vol. 84, No. 11, Nov. 1, 1996, pp. 1584-1614 XP011043780.

Search Report based on Italian Application Serial No. MI20091898, Ministero dello Sviluppo Economico, Jun. 18, 2010, pp. 3.

European Search Report for Application No. EP10189494, European Patent Office, Mar. 8, 2011, pp. 2.

European Search Report for Application No. EP10189487, European Patent Office, Mar. 8, 2011, pp. 3.

* cited by examiner

CIRCUIT FOR GENERATING A REFERENCE VOLTAGE

PRIORITY CLAIM

The instant application claims priority to Italian Patent Application No. MI2009A001898, filed Oct. 30, 2009, which application is incorporated herein by reference in its entirety.

RELATED APPLICATION DATA

This application is related to U.S. patent application Ser. No. 12/913,682, entitled CIRCUIT FOR GENERATING A REFERENCE VOLTAGE WITH COMPENSATION OF THE OFFSET VOLTAGE filed Oct. 27, 2010, now U.S. Pat. No. 8,482,342, issued Jul. 9, 2013; which application is incorporated herein by reference in its entirety.

TECHNICAL FIELD

An embodiment relates to a circuit for generating a reference voltage. In particular, an embodiment relates to a circuit for generating a reference voltage of the bandgap type.

BACKGROUND

Circuits for generating a reference voltage, also known simply by the term "voltage reference circuits", are circuits that play a vital role in various types of integrated circuits. In particular, a voltage reference circuit is capable of generating at least one electrical quantity with high accuracy and great stability, which quantity may be used as reference in various types of circuit blocks such as analog-to-digital converters, voltage regulators, measuring circuits, and so on. A voltage reference circuit is, therefore, provided with specific features such as good thermal stability and good electrical noise rejection, so as to be capable of providing an output voltage whose value is as independent as possible from voltage supply variations and from temperature changes of the circuit wherein it is integrated.

A class of voltage reference circuits widely known, with the features mentioned above, is the so-called bandgap voltage reference circuits class, or simply bandgap circuits. Briefly, a bandgap circuit exploits the forbidden band potential of silicon to generate an accurate reference voltage that is independent of the circuit operating temperature. The operation principle of a bandgap circuit is based on obtaining a bandgap voltage VBG that is (almost) independent of the circuit operating temperature by means of a bipolar transistor that implements the relation VBG=VBE+nVT, where VBE is the voltage between the base terminal and the emitter terminal of the bipolar transistor, VT is the thermal voltage (equal to kT/q, where k is the Boltzmann constant, T is the absolute temperature, and q the electron charge), and n is a multiplicative parameter calculated to obtain the desired compensation of the temperature variations of the voltage VBE. The voltage VBE between the base and emitter of a bipolar transistor decreases as the temperature increases—in the jargon, the voltage VBE is a quantity of the CTAT (Complementary To Absolute Temperature) type—, while the thermal voltage appears to be proportional to the temperature itself—in the jargon, the thermal voltage VT is a quantity of the PTAT (Proportional To Absolute Temperature) type.

According to an approach known in the state of the art, the bandgap voltage VBG may be generated by forcing a current Iptat provided by a current generator in a first reference circuit element comprising a transdiode coupled bipolar transistor, and mirroring the current Iptat in a second reference circuit element formed by a series of a resistor and a second transdiode coupled bipolar transistor having an emitter area different from that of the first bipolar transistor. Coupling the first reference circuit element and the second reference circuit element with respective input terminals of a high gain operational amplifier, and using the output of such operational amplifier to control the generator of the current Iptat, a negative feedback loop is established, which bears the first and second reference circuit elements voltages to a same value. With such a configuration, the current Iptat is found to be:

$$Iptat=[\ln(L1/L2)*(KT/q)]/Re,$$

where L1 and L2 are parameters proportional to the emitter areas, respectively, of the first bipolar transistor and of the second bipolar transistor, while Re is the resistance of the resistor comprised in the second reference circuit element; as may be seen from the equation, this current appears to be of the PTAT type, being proportional to the absolute temperature T. The current Iptat is then forced into a third reference circuit element comprising an element characterized by an electrical quantity of the CTAT type for generating the bandgap voltage VGB.

A major drawback that afflicts a configuration of this type is the extreme variability of the common-mode voltage of the operational amplifier input terminals. Indeed, this voltage being dependent from the base-emitter voltages VBE of the bipolar transistors included in the first and second reference circuit elements, it may vary, for example, in a range between 0.3 and 0.8 Volts depending on temperature and tolerances of the manufacturing process. Consequently, the operational amplifier is designed to handle the large input signal excursions without compromising the proper voltage reference circuit operation. However, this may be very difficult if the supply voltage has a reduced value, as happens in the circuits integrated using advanced CMOS (Complementary Metal Oxide Semiconductor) technologies. For example, in the 90 nm CMOS technology, the power supply has a nominal value equal to 1.2 Volts; this value may actually decrease until reaching 0.9 Volts when the circuit has been designed to operate during stand-by phases in order to minimize losses due to the leakage currents presence. In these cases, the common-mode voltage excursions due to temperature change may be too large, and the transistors of the operational amplifier input stage may be forced to operate in the triode operation region, and thus the amplifier may not operate correctly.

In order to solve the above mentioned drawbacks, a solution known in the art provides for using an operational amplifier whose input stage includes n-channel MOS transistors with reduced threshold voltage. However, although this allows the operational amplifier to operate correctly even in the presence of high excursions of the common-mode voltage, forming MOS transistors with reduced threshold voltage may require an additional lithography mask, and this may imply an increase in the whole circuit production costs.

According to a further solution known in the art, the common-mode voltage value is increased by introducing resistors in series with the first and second reference circuit elements and using the voltage drops that are generated as a result of the current Iptat flowing in these resistors. Nevertheless, the problem of the common-mode voltage excursion as a function of temperature may not be resolved; if the amplifier would be supplied with a low supply voltage value, with this solution the common-mode voltage may in fact exceed the supply voltage itself, compromising the proper functioning of the amplifier.

SUMMARY

In view of the state of the art herein illustrated, an embodiment overcomes the above mentioned drawbacks.

An embodiment relates to a bandgap voltage reference circuit for generating a bandgap reference voltage. Said circuit comprises a current generator controlled by a first driving voltage for generating a first current based on the driving voltage, and a first reference circuit element coupled with the controlled current generator for receiving the first current and generating a first reference voltage in response to the first current. The circuit further comprises a second reference circuit element for receiving a second current corresponding to the first current; Said second reference circuit element is adapted to generate a second voltage reference in response to the second current. Said circuit further comprises a third reference circuit element for receiving a third current corresponding to the first current and generating the bandgap reference voltage in response to the third current, and an operational amplifier. The operational amplifier has a first input terminal coupled to the first reference circuit element for receiving a first input voltage based on the first reference voltage, a second input terminal coupled to the second reference circuit element for receiving a second input voltage based on the second reference voltage, and an output terminal coupled to the controlled current generator for providing the first driving voltage to the current generator based on the difference between the first input voltage and the second input voltage. The circuit further comprises a control circuit comprising first capacitive means and second capacitive means. The first capacitive means have a first terminal coupled to the first reference circuit element for receiving the first reference voltage and a second terminal coupled to the first input terminal for providing the first input voltage. The second capacitive means comprises a first terminal coupled to the second reference circuit element for receiving the second reference voltage and a second terminal coupled to the second input terminal for providing the second input voltage. The control circuit further comprises biasing means for selectively providing a common-mode voltage to the second terminals of the first and second capacitive means.

Furthermore, an embodiment relates to a method for operating a bandgap voltage reference circuit.

BRIEF DESCRIPTION OF THE DRAWINGS

One or more embodiments, as well as features and advantages thereof, will be better understood by reference to the following detailed description, given purely by way of a non-restrictive indication and without limitation, to be read in conjunction with the attached figures. In particular.

DETAILED DESCRIPTION

Figure 1A:
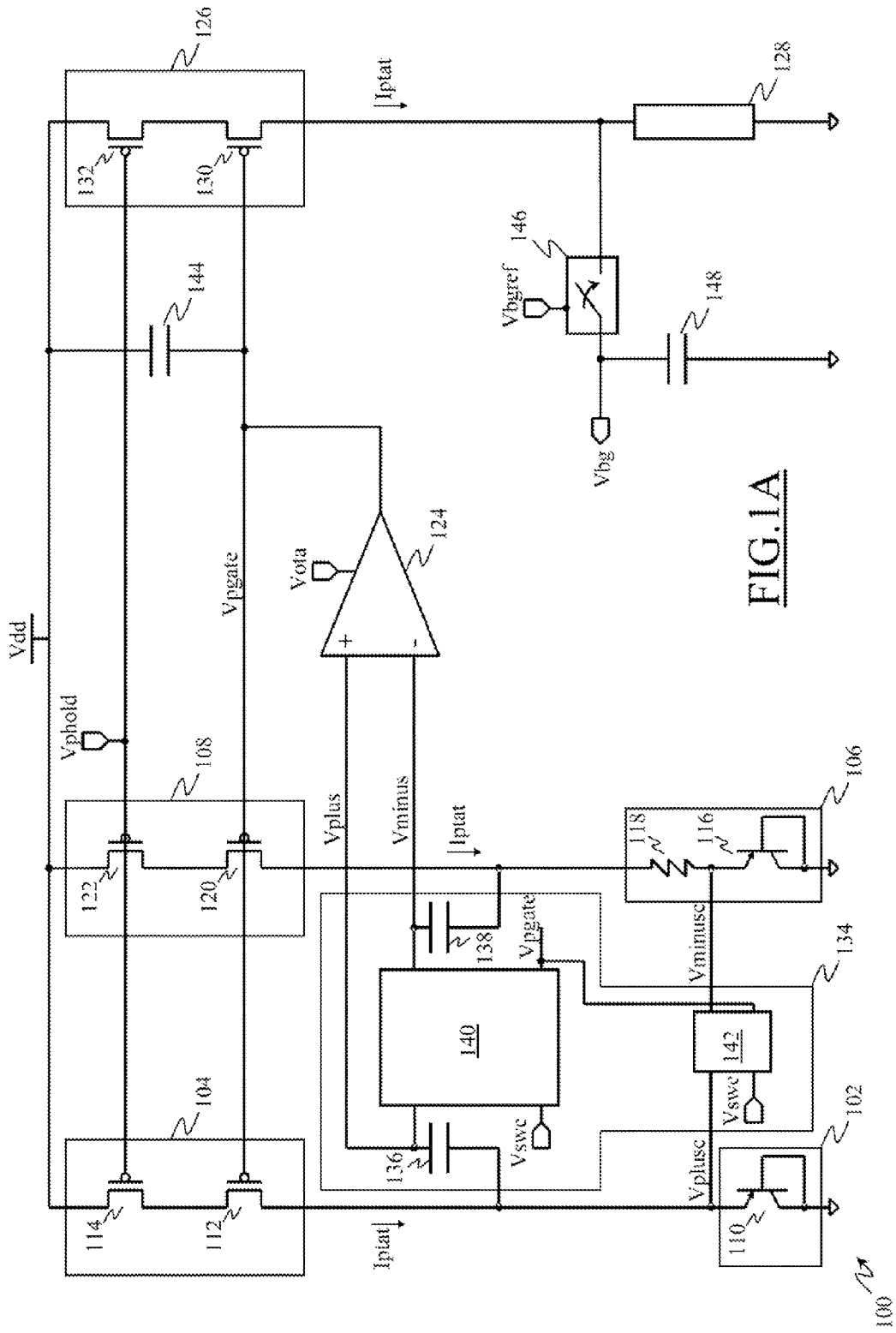
FIG. 1A shows a bandgap voltage reference circuit according to an embodiment.

With reference to FIG. 1A, a bandgap voltage reference circuit 100 is shown according to an embodiment.

The circuit 100 comprises a first reference circuit element 102 coupled to a first current generator 104 adapted to generate a current identified in figure with the reference Iptat. The circuit 100 also comprises a second reference circuit element 106 coupled to a second current generator 108; the current generator 108 is coupled with the current generator 104 in a mirror configuration.

The reference circuit element 102 comprises a bipolar PNP type transistor 110 having a collector terminal coupled to a terminal that provides a ground voltage, a base terminal coupled to the collector terminal and an emitter terminal coupled to a terminal of the current generator 104 which provides the current Iptat.

The current generator 104 comprises a first p-channel MOS transistor 112 having a drain terminal coupled to the transistor 110 emitter terminal for providing the current Iptat, a gate terminal coupled to current generator 108 and a source terminal coupled to a drain terminal of a second p-channel MOS transistor 114. The transistor 114 has a gate terminal coupled to the current generator 108 and a source terminal coupled to a terminal that provides a supply voltage Vdd. The gate terminal of the transistor 114 is also adapted to receive a hold signal Vphold used to selectively activate/deactivate the current Iptat supply. In particular, when the hold signal Vphold is at a low value, such as the ground voltage, the transistor 114 turns out to be turned on, while when the hold signal Vphold is at a high value, such as the supply voltage Vdd, the transistor 114 turns out to be turned off; in the latter case, the supplying of current Iptat results to be interrupted.

The reference circuit element 106 comprises a bipolar PNP type transistor 116 having a collector terminal coupled to a terminal providing the ground voltage, a base terminal coupled to the collector terminal and an emitter terminal coupled to a first terminal of a resistor 118. The resistor 118 comprises a second terminal coupled to a terminal of the current generator 108 that provides a mirrored version of the current Iptat.

The current generator 108 comprises a first p-channel MOS transistor 120 having a drain terminal coupled to the resistor 118 to provide the current Iptat, a gate terminal coupled to the gate terminal of the transistor 112 and a source terminal coupled to the drain terminal of a second p-channel MOS transistor 122. The transistor 122 has a gate terminal coupled to the gate terminal of the transistor 114 and a source terminal coupled to a terminal providing the supply voltage Vdd.

The circuit 100 also comprises an operational amplifier 124 comprising a non-inverting input terminal ("+") coupled to the transistor 110 emitter terminal, an inverting input terminal ("−") coupled to the resistor 118 second terminal and an output terminal coupled to the current generators 104, 108 for providing a driving voltage Vpgate to the gate terminals of the transistors 112 and 120 in order to adjust the current Iptat value. According to an embodiment, the operational amplifier 124 has a differential input stage comprising an input pair formed by n-channel MOS transistors, each biased by a bias current corresponding to the current Iptat. The operational amplifier 124 may also be turned on (and off) in a selective manner depending on the value assumed by a control signal Vota provided to a control terminal of the amplifier. In an embodiment, the operational amplifier 124 has a high gain and a high output impedance.

Figure 1B:
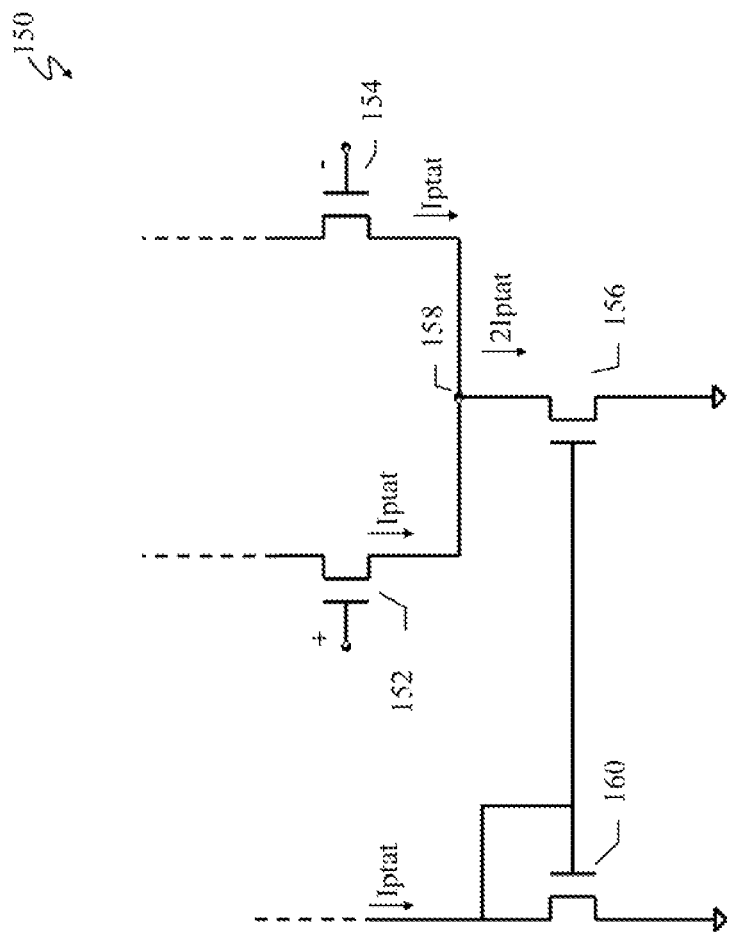
FIG. 1B shows a portion of an input stage of an embodiment of an operational amplifier in the circuit of FIG. 1A.

FIG. 1B shows the circuit structure of an input stage portion—identified in the figure with the reference 150—of the operational amplifier 124 according to an embodiment.

The input stage 150 comprises a pair of n-channel MOS transistors 152, 154 coupled in differential configuration. In particular, the transistor 152 has a drain terminal coupled to a load (not shown in the figure), a gate terminal that represents the non-inverting terminal of the operational amplifier 124, and a source terminal coupled to a drain terminal of an n-channel MOS transistor 156 (circuit node 158) adapted to provide the bias current of the transistors 152 and 154. The transistor 154 has a drain terminal coupled to a load (not shown in the figure), a gate terminal which is the inverting terminal of the operational amplifier 124, and a source terminal coupled to the node 158.

The transistor 156 comprises a source terminal coupled to a terminal that provides the ground voltage and a gate terminal coupled to a gate terminal of a further n-channel MOS transistor 160. The transistor 160 has a source terminal coupled to a terminal that provides the ground voltage and a drain terminal coupled to the gate terminal. The transistor 160 is configured to conduct a current equal to the current Iptat; such current may for example be supplied to the transistor 160 from a circuit constructed like one of the current generators 104 and 108 of the circuit 100.

According to an embodiment, the transistors 152, 154 and 160 have the same form factor FF=W/L—where W is the gate region width and L is the gate region length—, while the transistor 156 has a form factor FF' equal to 2*W/L. In this way, the drain current of the transistor 156 turns out to be twice the drain current of the transistor 160, i.e., 2*Iptat. Given the structure symmetry, if the pair of transistors 152, 154 does not appear to be overly unbalanced (e.g., if the amplifier operates in the so-called amplification region) each transistor of the pair 152, 154 is conducting, at least approximately, a current value equal to Iptat.

Still referring to FIG. 1A, the presence of the operational amplifier 124 having the inputs coupled to the reference circuit elements 102, 106 and the output coupled to the current generators 104 and 108 determines the presence of a negative feedback loop, through which the voltage of the first and second circuit elements 102, 106 are brought to a same value, and the generated current Iptat appears to be proportional to the absolute temperature, i.e., it turns out to be a quantity of the PTAT type.

The current Iptat thus generated is then mirrored by a third current generator 126 and forced into a third reference circuit element 128 for generating a bandgap voltage Vbg, which represents the circuit 100 output. Without going into details already known to those skilled in the art, the reference circuit element 128 may be formed by a resistive divider comprising an element characterized by an electrical quantity of the CTAT type—such as the voltage between the base and emitter of a transdiode coupled bipolar transistor—which compensates for the PTAT behavior of the current Iptat.

The current generator 126 comprises in particular a first p-channel MOS transistor 130 having a drain terminal coupled to the reference circuit element 128 for providing the current Iptat, a gate terminal coupled to the gate terminal of the transistor 112 and a source terminal coupled to the drain terminal of a second p-channel MOS transistor 132. The transistor 132 has a gate terminal coupled to the gate terminal of the transistor 114 and a source terminal coupled to a terminal providing the supply voltage Vdd.

According to an embodiment, the value of the common-mode voltage at the inputs of the operational amplifier 124 is adjusted by a common mode management circuit block—identified in the figure with the reference 134—so that the MOS transistors of the operational amplifier 124 input stage always operate in saturation. As will become clearer later in this description, the circuit block 134 is configured to receive the reference voltages of the reference circuit elements 102, 106, and appropriately shift them using capacitors in series with the operational amplifier 124 inputs. In particular, a first capacitor 136 has a first terminal coupled to the emitter terminal of the transistor 110 for receiving a voltage Vplusc and a second terminal coupled to the non-inverting input terminal of the operational amplifier 124 to provide a voltage Vplus; a second capacitor 138 has instead a first terminal coupled to the second terminal of the resistor 118 and a second terminal coupled to the inverting input terminal of the operational amplifier 124 to provide a voltage Vminus.

The circuit block 134 includes two main sub-blocks, i.e., a biasing block 140 and a short-circuit block 142.

The biasing block has a first terminal for receiving a digital control signal Vswc, a second terminal for receiving the driving voltage Vpgate, a third terminal coupled to capacitor 136 second terminal, and a fourth terminal coupled to the capacitor 138 second terminal. As will be described below, the biasing block 140 is adapted to generate the common-mode voltage that is actually supplied to the operational amplifier 124 inputs; Said voltage is selectively forced to the operational amplifier 124 inputs according to the control signal Vswc short-circuiting the second terminals of the capacitors 136 and 138 coupled to the operational amplifier 124 inputs. In this way the voltages Vplus and Vminus are brought to the voltage value determined by the biasing block 140.

The short-circuit block 142 has a first terminal for receiving the control signal Vswc, a second terminal for receiving the driving voltage Vpgate, a third terminal coupled to the emitter terminal of the transistor 110 for receiving the voltage Vplusc, and a fourth terminal coupled to the emitter terminal of the transistor 116 for receiving a voltage Vminusc. The short-circuit block 142 is capable of selectively short-circuiting the emitter terminal of the transistor 110 with the emitter terminal of the transistor 116 according to the control signal Vswc.

In addition, in order to allow the voltages across the capacitors 136 and 138 to be updated with the values generated by the biasing block 140, and at the same time ensure a proper operation of the system, the circuit 100 has a "sample and hold" type architecture, whose operation comprises an alternating sequence of holding phases (hold signal Vphold high) and regeneration phases (hold signal Vphold low). In particular, the circuit 100 is provided with a first retention capacitor 144 coupled between a terminal that provides the supply voltage Vdd and the operational amplifier 124 output terminal for storing the driving voltage Vpgate when the operational amplifier 124 is turned off, and a circuit for sampling and holding the bandgap voltage Vbg. The circuit for sampling and holding the bandgap voltage Vbg comprises a controlled switch 146 having a first conduction terminal coupled to the drain terminal of the transistor 130, a second conduction terminal to provide the bandgap voltage Vbg and a control terminal to receive a sampling signal Vbgref; the circuit for sampling and holding the bandgap voltage Vbg also comprises a second retention capacitor 148 having a first terminal coupled to the second conduction terminal of the controlled switch 146 and a second terminal coupled to a terminal which receives the ground voltage. When the sampling signal is asserted, for example at the supply voltage Vdd, the controlled switch is closed, and the bandgap voltage Vbg is determined by the voltage drop generated across the reference circuit element 128 crossed by the current Iptat. When the sampling signal is deasserted, for example at the ground voltage, the controlled switch is open, and the bandgap voltage Vbg is determined by the voltage drop across the capacitor 148.

Figure 2:
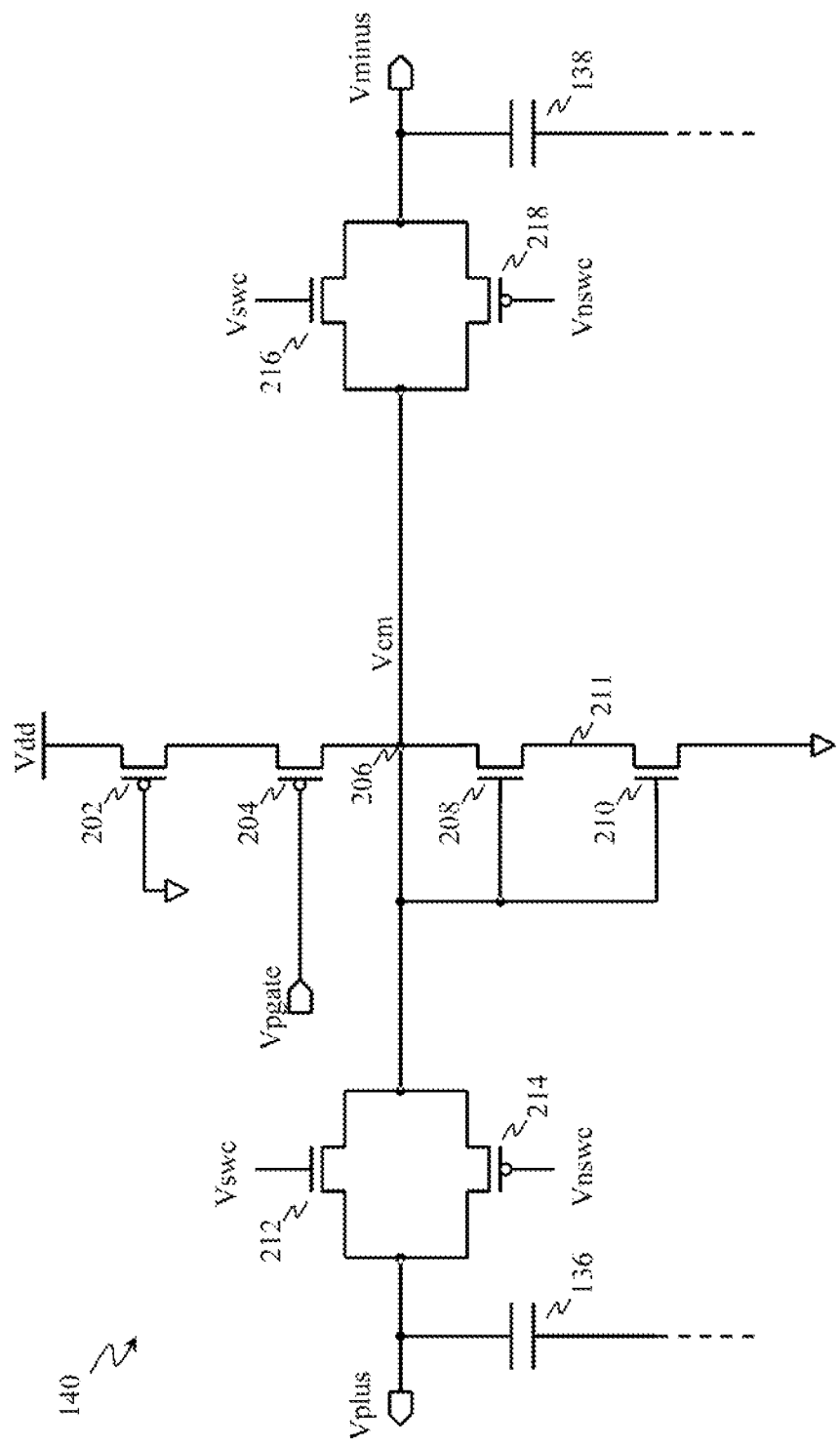
FIG. 2 shows the circuit structure of a biasing block in the circuit of FIG. 1A according to an embodiment.

The biasing block 140 circuit structure according to an embodiment is illustrated in FIG. 2.

The block 140 includes a bias current generator comprising two p-channel MOS transistors 202, 204. The transistor 202 has a source terminal coupled to a terminal providing the supply voltage Vdd, a gate terminal coupled to a terminal that provides the ground voltage and a drain terminal coupled to a source terminal of the transistor 204. The transistor 204 has a gate terminal that receives the driving voltage Vpgate, and the drain terminal coupled to a circuit node identified in the figure with the reference 206. The transistors 202, 204 are sized in a similar manner (e.g., equal) to the transistors 112, 114 of the current generator 104. Consequently, since the gate terminal of the transistor 204 is driven by the same driving signal Vpgate provided to the gate terminal of the transistor 112, the current generated by the transistor 204 matches (for example, is equal) to the current Iptat.

The biasing block 140 also includes a common mode generator comprising two n-channel MOS transistors 208, 210 adapted to bias the node 206 with a common-mode voltage Vcm. The transistor 208 has a drain terminal and a gate terminal coupled to the node 206, and a source terminal coupled to a drain terminal of the transistor 210 (circuit node 211). The transistor 210 has a gate terminal coupled to the circuit node 206, and a source terminal coupled to a terminal that provides the ground voltage.

The biasing block 140 further comprises a first transmission gate adapted to selectively connect the node 206 with the second terminal of the capacitor 136 according to the value assumed by the control signal Vswc, and a second transmission gate adapted to selectively connect the node 206 with the second terminal of the capacitor 138 as a function of control signal Vswc. In particular, the first transmission gate comprises a n-channel MOS transistor 212 having a first conduction terminal coupled to the node 206, a gate terminal driven by the control signal Vswc and a second conduction terminal coupled to the second terminal of the capacitor 136 and a p-channel MOS transistor 214 having a first conduction terminal coupled to the node 206, a gate terminal driven by a negated version of the control signal Vswc, identified in the figure with the reference Vnswc, and a second conduction terminal coupled the second terminal of the capacitor 136; the second transmission gate comprises an n-channel MOS transistor 216 having a first conduction terminal coupled to the node 206, a gate terminal driven by the control signal Vswc and a second conduction terminal coupled to the second terminal of the capacitor 138, and a p-channel MOS transistor 218 having a first conduction terminal coupled to the node 206, a gate terminal driven by the signal Vnswc, and a second conduction terminal coupled to the second terminal of the capacitor 138.

In this way, when the control signal Vscw is asserted (e.g., to the value of the supply voltage Vdd), both the transmission gates are closed, and the voltages Vplus and Vminus provided to operational amplifier 124 inputs assume the common-mode voltage Vcm value generated by the transistors 208 and 210. According to an embodiment, the transistors 208 and 210 are sized so that the common-mode voltage Vcm generated by them has a value such that the transistors 152, 154 and 156 of the input stage 150 of the operational amplifier 124 operate in the saturation zone.

In particular, in an embodiment the transistor 208 has a form factor FF that is equal to the form factor FF of the transistors 152, 154 and 160 of the input stage 150, while the transistor 210 has a form factor FF"=W/(X*L), where X is a scale factor greater than or equal to three. In other words, according to an embodiment, the common-mode voltage Vcm optimal value is obtained by making the transistor 210 more resistive than the transistors 152, 154 and 160 of the input stage 150 of the operational amplifier 124.

In order to understand why a more resistive transistor 210 is capable of generating an optimal common-mode voltage Vcm such that the transistors of the input stage 150 of the operational amplifier 124 work in the saturation zone, reference will be now made jointly to FIGS. 1B and 2.

During circuit operation, the transistor 208 of the biasing block 140 operates in the saturation zone, while the transistor 210 operates in the triode zone. Consequently, the current Iptat through these transistors is equal to:

$$Iptat=(\beta/X)*(Vcm-Vth-\tfrac{1}{2}*Vx)*Vx \text{(current of the transistor 210)};$$

$$Iptat=(\beta)*(Vcm-Vx-Vth)^2 \text{(current of the transistor 208)},$$

where $\beta$ is the transistor 208 gain, X is the transistor 210 scaling factor, Vth is the threshold voltage of the transistors 208 and 210, and Vx is the voltage at the node 211 of the biasing block 140. Equating the above equations yields the following relationship:

$$Vx=(\sqrt{(1+X)}-1)*\sqrt{(2*Iptat/\beta)}, \qquad (1)$$

where $\sqrt{(\ )}$ is the square root operation.

In order that the transistor 156 of input stage 150 of the operational amplifier 124 operates in the saturation zone, the following condition is fulfilled:

$$Vc > \sqrt{(2*Iptat/\beta)}, \qquad (2)$$

where Vc is the voltage at the node 158 of the input stage 150.

Since, in the amplification operating region, the transistors 152 and 154 of the input stage 150 of the operational amplifier 124 are conduct a current Iptat, applying the common-mode voltage Vcm generated by the biasing block 140 to the gate terminals of the transistors 152 and 154, the voltage Vc at node 158 of the input stage 150 assumes a value equal to the voltage Vx at the node 211 of the biasing block 140. In other words, the condition for which the transistor 156 of the input stage 150 works in the saturation zone becomes:

$$Vx > \sqrt{(2*Iptat/\beta)}. \qquad (3)$$

According to the relation (1), the condition (3) becomes:

$$(\sqrt{(1+X)}-1)*\sqrt{(2*Iptat/\beta)} > \sqrt{(2*Iptat/\beta)}, \qquad (4)$$

i.e.:

$$(\sqrt{(1+X)}-1) > 1. \qquad (5)$$

Solving with respect to X, the condition (5) becomes:

$$X > 3, \qquad (6)$$

i.e., the condition for having an optimum value for the common-mode voltage Vcm to be provided to operational amplifier 124 is setting for the transistor 210 a form factor FF"=W/(X*L) equal to one third (or less) of the form factor FF of the transistors 152, 154 of the operational amplifier 124.

Figure 3:
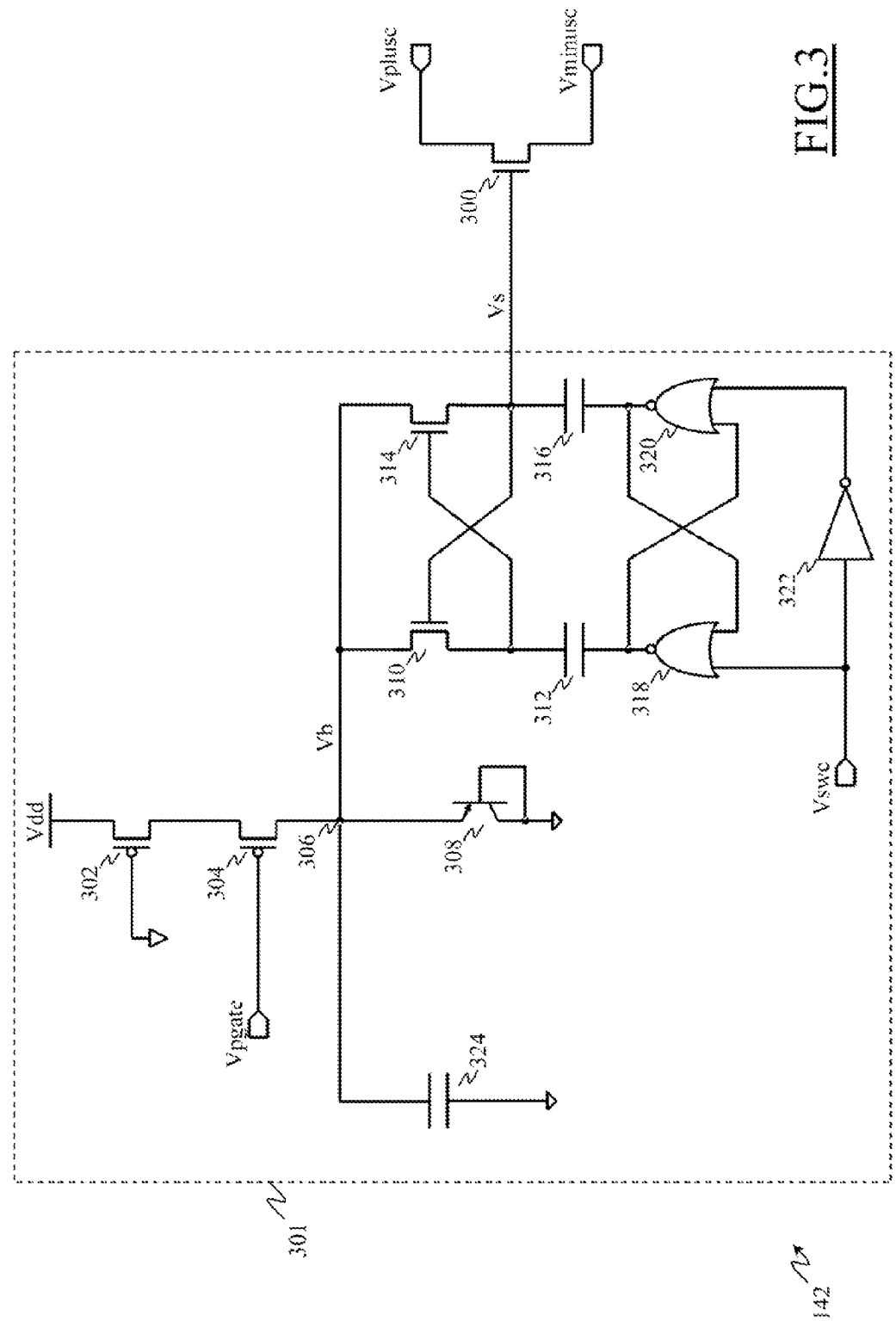
FIG. 3 illustrates the circuit structure of a short-circuit block in the circuit of FIG. 1A according to an embodiment.

The circuit structure of the short-circuit block 142 according to an embodiment is illustrated in FIG. 3.

The short-circuit block 142 includes two sections, namely a controlled switch 300 adapted to selectively short-circuit the emitter terminals of the transistors 110 and 116 comprised in the reference circuit elements 102 and 106, and a driver circuit 301 capable of driving the controlled switch 300 according to the control signal Vswc.

The controlled switch 300 is formed by an n-channel MOS transistor, having a first conduction terminal coupled to the emitter terminal of the transistor 110 to receive the voltage Vplusc, a second conduction terminal coupled to the emitter terminal of the transistor 116 to receive the voltage Vminusc, and a gate terminal coupled to the driver circuit 301 for receiving a driving voltage Vs. Given that in modern integrated circuits the supply voltage Vdd typically has a very small value, in order to correctly drive the controlled switch 300 it may be necessary that the driving voltage Vs is able to assume values greater than the supply voltage Vdd one. On the other hand, in order to prevent the occurrence of circuit malfunctions, the maximum value the driving voltage Vs may assume is lower than the oxide breakdown voltage of the controlled switch 300.

For this reason, according to an embodiment, the driving circuit 301 that generates the driving voltage Vs is a so-called "boost" circuit, and in particular is a circuit of the "clock booster" type. In detail, the driving circuit 301 comprises a current generator comprising two p-channel MOS transistors 302, 304. The transistor 302 has a source terminal coupled to a terminal providing the supply voltage Vdd, a gate terminal coupled to a terminal that provides the ground voltage and a drain terminal coupled to a source terminal of the transistor 304. The transistor 304 has a gate terminal that receives the driving voltage Vpgate, and the drain terminal coupled to a circuit node identified in the figure with the reference 306. The transistors 302, 304 are sized in a similar manner (e.g., equal) to the transistors 112, 114 of the current generator 104. Consequently, since the gate terminal of the transistor 304 is driven by the same driving signal Vpgate provided to the gate terminal of the transistor 112, the current generated by transistor 304 corresponds (for example, appears to be equal) to the current Iptat.

The driving circuit 301 also comprises a bipolar p-channel transistor 308 having an emitter terminal coupled to the node 306, a collector terminal coupled to a terminal that provides the ground voltage, and a base terminal coupled to the collector terminal. The transistor 308 is sized in a similar way (i.e., equal) to the transistor 110 included in the reference circuit element 102, so that the voltage of node 306, identified in the figure with the reference Vb, is as close as possible to the value of the voltages Vplusc, Vminusc of the emitter terminals of the transistors 110 and 116.

The node 306 is also coupled to a drain terminal of a n-channel MOS transistor 310, which transistor has a source terminal coupled to a first terminal of a capacitor 312 and a gate terminal coupled to a source terminal of a further n-channel MOS transistor 314. The transistor 314 further comprises a drain terminal coupled to the node 306 and a gate terminal coupled to the source terminal of the transistor 310; the source terminal of the transistor 314 is also coupled to a first terminal of a capacitor 316 and to the gate terminal of the controlled switch 300 to provide the driving voltage Vs The capacitor 312 also comprises a second terminal coupled to an output terminal of a first two-input NOR logic gate, identified in the figure with the reference 318. The capacitor 316 comprises a second terminal coupled to an output terminal of a second two-input NOR logic gate, identified in the figure with the reference 320. The NOR gate 318 comprises a first input terminal capable of receiving the control signal Vswc and a second input terminal coupled to the output terminal of the NOR gate 320; the NOR gate 320 comprises a first input terminal coupled to the output terminal of the NOR gate 318 and a second input terminal coupled to an output terminal of a NOT logic gate 322. The NOT gate 322 comprises an input terminal capable of receiving the control signal Vswc.

When the control signal Vswc is deasserted to the ground voltage, the output of the NOR gate 318 is brought to the supply voltage Vdd, while the output of the NOR gate 320 is brought to the ground voltage. In this situation, the gate terminal of the transistor 314 is brought to a voltage value approximately equal to Vb+Vdd; consequently, the transistor 314 is turned on while the transistor 310 is off, and the driving voltage Vs has a value equal to the voltage Vb. Since the driving circuit 301 is sized such that the voltage Vb has a value similar to that of the voltages Vplusc, Vminusc, in this condition the controlled switch 300 is open.

When the control signal Vswc is instead asserted to the supply voltage, the output of the NOR gate 320 is brought to the power supply voltage Vdd, while the output of the NOR gate 318 is brought to the ground voltage. Consequently, the gate terminal of the transistor 314 is brought to a voltage of about Vb; therefore, the transistor 314 is turned off while the transistor 310 is turned on, and the driving voltage Vs is brought to a value equal to Vb+Vdd. In this condition, the controlled switch 300 is closed.

The driving circuit 301 also comprises a capacitor 324 coupled between the node 306 and a terminal that provides the ground voltage. The function of this capacitor is to provide the electrical charge needed to compensate for the inevitable changes in the voltage Vb of the node 306 that occur due to the switching of the NOR gates 318 and 320.

Figure 4:
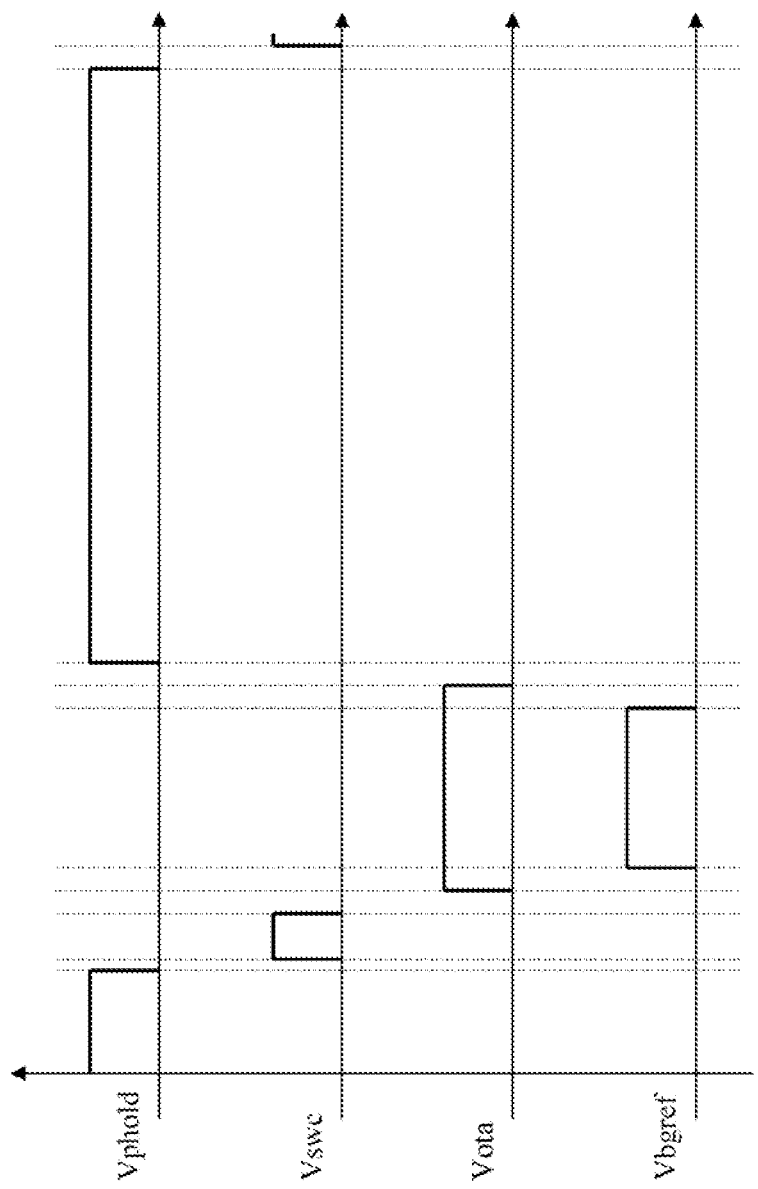
FIG. 4 is a timing diagram that shows the evolution over time of some of the signals generated by and received from an embodiment of the circuit of FIG. 1A.

The overall operation of an embodiment of the circuit 100 will be now described, referring to the figures previously described in conjunction with the FIG. 4; FIG. 4 is a timing diagram illustrating the trend in time of some of the signals generated/received by the circuit 100.

As described above, the circuit 100 according to an embodiment, has a "sample and hold" architecture, whose operation comprises a sequence of alternating holding phases and regeneration phases scanned by the value assumed by the hold signal—in particular, during the holding phases the hold signal Vphold is at a high voltage level, while during the regeneration phases that signal is at a low voltage level.

Consequently, at the beginning of each regeneration phase, the hold signal Vphold is brought to a low voltage level (ground voltage). In this situation, the transistors 114, 122 and 132 are turned on, and the current generators 104, 108, 126 are enabled to generate the current Iptat in various branches of the circuit.

Subsequently, the control signal Vota as well is brought to a low voltage level (ground voltage) in order to disable the operational amplifier 124, and bring the output thereof in a high impedance state. It is stressed that in this phase the driving voltage Vpgate is equal to the value corresponding to the charge that was stored in the capacitor 144 during the previous holding phase, set in turn by a previous activation of the operational amplifier 124.

The control signal Vswc is then brought to a high voltage level (Vdd) to turn on the biasing block 140 and the short-circuit block 142. In particular, the transmission gates of the biasing block 140 are closed, shorting the second terminal of the capacitor 136 with the second terminal of the capacitor 138; simultaneously, the controlled switch 300 of the short-circuit block 142 is closed, too, in order to short circuit the emitter terminal of the transistor 110 (coupled to the first terminal of the capacitor 136) with the emitter terminal of the transistor 116 (coupled to the first terminal of the capacitor 138 through the resistor 118). In this situation, the voltage Vplus at the non-inverting terminal of the operational amplifier 124 and the voltage Vminus at the inverting terminal of the operational amplifier 124 are brought to the common-mode voltage Vcm generated by the transistors 208 and 210 of the biasing block 140, while a voltage drop dVc equal to:

$$dVc=(Vcm-Veb),$$

is set on the capacitors 136 and 138, where Veb=Vplusc=Vminusc. In another embodiment, the block 142 may short circuit the emitter of the transistor 110 to the drain of the transistor 120 (i.e., Vminusc coupled to the node of the resistor 18 coupled to the capacitor 138) to achieve a similar result of biasing the capacitors 136 and 138 to set a common-mode voltage for the amplifier 124.

Therefore, according to an embodiment, the common-mode voltage at the operational amplifier 124 inputs is set to the value Veb generated by the reference circuit elements 102, 106 plus a shift value dVc generated by electronic devices that are subject to conditions (such as biasing and temperature) very similar to those the components of the operational amplifier 124 are subjected to, and that also were manufactured during the same manufacturing process. In other words, according to an embodiment, the common-mode voltage at the operational amplifier 124 inputs is set to a value, which follows the variations in temperature and the polarization the circuit 100 is subject to, and which appears to be calibrated according to the specific parameters of the process by means of which the circuit 100 was manufactured.

At this point the control signal Vswc is brought to a low voltage level (ground voltage), so that the transmission gates of the biasing block 140 and the controlled switch 300 of the short-circuit block 142 are opened.

Subsequently, the control signal Vota is brought to a high voltage level (Vdd), so as to enable the operational amplifier 124, and allow the negative feedback loop between the voltage across the reference circuit elements 102, 106 and the driving voltage Vpgate of the current generators 104, 108 and 126. In particular, the driving voltage Vpgate across the capacitor 144 is regenerated by the operational amplifier 124 based on values assumed by the voltages Vplus and Vminus.

The sampling signal Vbgref is thus brought to a high voltage level (Vdd) to close the controlled switch 146 in order to regenerate the bandgap voltage Vbg across the capacitor 148.

Thereafter, both the sampling signal Vbgref and the control signal Vota are brought to a low voltage level (ground voltage) in order to open the controlled switch 146 and disable the operational amplifier 124. The voltages Vbg and Vpgate are then stored by the capacitors 148 and 144.

At this point the hold signal Vphold is brought to a high voltage level (Vdd), and the holding phase starts. During the holding phase, the power consumption is minimized due to the fact that the transistors 114, 122 and 132 are disabled, so the generation of the current Iptat by the current generators 104, 108, 126 is inhibited. The values of the voltages Vpgate and Vbg used by the circuit 100 during the whole holding phase correspond to those stored in the capacitors 148 and 144.

In conclusion, the circuit 100 according to an embodiment allows setting a common-mode voltage, which may be optimal, suitable for applications with low supply voltages; in addition, because of the "sample and hold" type architecture, the current consumption may substantially reduced compared to solutions known in the state of the art.

Naturally, in order to satisfy local and specific requirements, a person skilled in the art may apply to the solution described above many modifications. Particularly, one or more embodiments have been described with a certain degree of particularity, it should be understood that various omissions, substitutions and changes in the form and details as well as other embodiments are possible; moreover, it is expressly intended that specific elements and/or method steps described in connection with any disclosed embodiment may be incorporated in any other embodiment as a general matter of design choice.

For example, similar considerations apply if the reference circuit elements have a different but equivalent structure, such as the presence in at least one reference circuit element of more bipolar transistors coupled in parallel with each other.

Moreover, even if the above-described current generators were sized to mirror the current generated with a mirror ratio equal to 1:1, the above-described concepts may be applied to cases with different mirroring ratios.

In addition, the common node voltage generated by the biasing block may be achieved in other ways, such as using a single transistor sufficiently resistive to allow the transistors of the operational amplifier input stage to operate in the saturation zone.

Similar considerations apply to the driver circuit of the short-circuit block, which may have a different circuit structure, such as a boost circuit that does not belong to the category of the clock booster circuits.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated. Moreover, an embodiment of a circuit may be replaced with its electrical dual.

The invention claimed is:

1. A circuit, comprising:
   a first branch configured to generate a first current;
   a second branch configured to generate a second current;
   an amplifier having a first amplifier input node coupled to the first branch, a second amplifier input node coupled to the second branch, and an amplifier output node coupled to the first and second branches; and
   a first bias unit having first and second capacitive elements coupled to the first and second branches, respectively, and configured to provide first and second bias signals to the first and second amplifier input nodes, respectively, such that the amplifier is configured to cause the first current to approximately equal the second current;
   wherein the first capacitive element includes a first node coupled to the first branch and a second node coupled to the first amplifier input node.

2. The circuit of claim 1, further comprising:
   first and second supply nodes; and
   wherein one of the first and second branches comprises:
   a first transistor having a control node coupled to the output node of the amplifier, having a first conduction node coupled to the first supply node, and having a second conduction node; and
   a second transistor configured as a diode and having a first conduction node coupled to the second conduction node of the first transistor and having a second conduction node coupled to the second supply node.

3. The circuit of claim 1, further comprising:
   first and second supply nodes; and
   wherein one of the first and second branches comprises:
   an insulated gate transistor having a control node coupled to the output node of the amplifier, having a first conduction node coupled to the first supply node, and having a second conduction node; and
   a bipolar transistor configured as a diode and having a first conduction node coupled to the second conduction node of the insulated gate transistor and having a second conduction node coupled to the second supply node.

4. The circuit of claim 1, further comprising:
first and second supply nodes; and
wherein one of the first and second branches comprises:
a P-channel transistor having a gate node coupled to the output node of the amplifier, having a source node coupled to the first supply node, and having a drain node; and
a PNP transistor having an emitter node coupled to the drain node of the P channel transistor, a base node, and a collector node coupled to the base node and to the second supply node.

5. The circuit of claim 1, further comprising:
first and second supply nodes; and
wherein one of the first and second branches comprises:
a first transistor having a control node coupled to the output node of the amplifier, having a first conduction node coupled to the first supply node, and having a second conduction node;
an impedance element having a first node coupled to the second conduction node of the first transistor and having a second node; and
a second transistor configured as a diode and having a first conduction node coupled to the second node of the impedance element and having a second conduction node coupled to the second supply node.

6. The circuit of claim 1, further comprising:
first and second supply nodes; and
wherein one of the first and second branches comprises:
an insulated gate transistor having a control node coupled to the output node of the amplifier, having a first conduction node coupled to the first supply node, and having a second conduction node;
an impedance component having a first node coupled to the second conduction node of the insulated gate transistor and having a second node; and
a bipolar transistor configured as a diode and having a first conduction node coupled to the second node of the impedance component and having a second conduction node coupled to the second supply node.

7. The circuit of claim 1, further comprising:
first and second supply nodes; and
wherein one of the first and second branches comprises:
a P-channel transistor having a gate node coupled to the output node of the amplifier, having a source node coupled to the first supply node, and having a drain node;
a resistor having a first node coupled to the drain node of the P channel transistor and having second node; and
a PNP transistor having an emitter node coupled to the second node of the resistor, a base node, and a collector node coupled to the base node and to the second supply node.

8. The circuit of claim 1 wherein the amplifier comprises a differential input operational amplifier.

9. The circuit of claim 1 wherein the amplifier comprises an operational amplifier.

10. The circuit of claim 1 wherein the amplifier comprises a differential input stage including:
first and second supply nodes;
a first transistor having a control node coupled to the first amplifier input node, a first conduction node coupled to the first supply node, and a second conduction node;
a second transistor having a control node coupled to the second amplifier input node, a first conduction node coupled to the first supply node, and a second conduction node coupled to the second conduction node of the first transistor; and
a third transistor having a control node, a first conduction node coupled to the second conduction nodes of the first and second transistors, and a second conduction node coupled to the second supply node, the third transistor configured to conduct a third current that is approximately equal to the sum of the first current and the second current.

11. The circuit of claim 1 wherein:
the amplifier comprises a differential input stage including:
first and second supply nodes;
a first transistor having a control node coupled to the first amplifier input node, a first conduction node coupled to the first supply node, and a second conduction node;
a second transistor having a control node coupled to the second amplifier input node, a first conduction node coupled to the first supply node, and a second conduction node coupled to the second conduction node of the first transistor;
a third transistor having a control node, a first conduction node coupled to the second conduction nodes of the first and second transistors, and a second conduction node coupled to the second supply node, the third transistor configured to conduct a third current that is approximately equal to the sum of the first current and the second current; and
the first bias unit is configured to provide the first and second bias signals having respective values such that the third transistor is configured in a region wherein the third current is approximately independent of a voltage across the first and second conduction nodes of the third transistor.

12. The circuit of claim 1 wherein:
the amplifier comprises a differential input stage including:
first and second supply nodes;
a first MOS-type transistor having a control node coupled to the first amplifier input node, a first conduction node coupled to the first supply node, and a second conduction node;
a second MOS-type transistor having a control node coupled to the second amplifier input node, a first conduction node coupled to the first supply node, and a second conduction node coupled to the second conduction node of the first transistor;
a third MOS-type transistor having a control node, a first conduction node coupled to the second conduction nodes of the first and second transistors, and a second conduction node coupled to the second supply node, the third transistor configured to conduct a third current that is approximately equal to the sum of the first current and the second current; and
the first bias unit is configured to provide the first and second bias signals having respective values such that the third transistor is configured in a saturation region.

13. The circuit of claim 1 wherein:
the amplifier comprises a differential input stage including:
first and second supply nodes;
a first MOS-type transistor having a control node coupled to the first amplifier input node, a first conduction node coupled to the first supply node, and a second conduction node;
a second MOS-type transistor having a control node coupled to the second amplifier input node, a first conduction node coupled to the first supply node, and a second conduction node coupled to the second conduction node of the first transistor;
a third MOS-type transistor having a control node, a first conduction node coupled to the second conduction nodes of the first and second transistors, and a second conduction node coupled to the second supply node, the third transistor configured to conduct a third current that is approximately equal to the sum of the first current and the second current; and
the first bias unit is configured to provide the first and second bias signals having respective values such that the first, second, and third transistors are configured in respective saturation regions.

14. The circuit of claim 1 wherein the amplifier comprises:
a differential input stage including:
first and second supply nodes;
a first transistor having a control node coupled to the first amplifier input node, a first conduction node coupled to the first supply node, and a second conduction node;
a second transistor having a control node coupled to the second amplifier input node, a first conduction node coupled to the first supply node, and a second conduction node coupled to the second conduction node of the first transistor; and
a third transistor having a control node, a first conduction node coupled to the second conduction nodes of the first and second transistors, and a second conduction node coupled to the second supply node; and
a second bias unit coupled to the control node of the third transistor and configured to cause the third transistor to conduct a third current that is approximately equal to twice one of the first and second currents.

15. The circuit of claim 1 wherein the first branch is configured to generate the first current to be approximately proportional to temperature.

16. The circuit of claim 1 wherein the second branch is configured to generate the second current to be approximately proportional to temperature.

17. The circuit of claim 1, further comprising a reference generator configured to generate a reference signal in response to one of the first and second currents.

18. The circuit of claim 1, further comprising:
wherein the first and second branches are respectively configured to generate the first and second currents to be approximately proportional to temperature;
a third branch coupled to the amplifier output node, configured to conduct a third current, and configured to convert the third current into a reference voltage that is approximately independent of temperature; and
wherein the first bias unit is configured to provide the first and second bias signals such that the amplifier is configured to cause the third current to equal approximately the first current and equal approximately the second current and to be approximately proportional to temperature.

19. A circuit, comprising:
a first branch configured to generate a first current;
a second branch configured to generate a second current;
an amplifier having a first amplifier input node coupled to the first branch, a second amplifier input node coupled to the second branch, and an amplifier output node coupled to the first and second branches; and
a first bias unit configured to provide first and second bias signals to the first and second amplifier input nodes, respectively, such that the amplifier is configured to cause the first current to approximately equal the second current;
wherein the first bias unit comprises:
a first capacitor having a first node coupled to the first branch and having a second node coupled to the first amplifier input node; and
a second capacitor having a first node coupled to the second branch and having a second node coupled to the second amplifier input node.

20. A circuit, comprising:
a first branch configured to generate a first current;
a second branch configured to generate a second current;
an amplifier having a first amplifier input node coupled to the first branch, a second amplifier input node coupled to the second branch, and an amplifier output node coupled to the first and second branches; and
a first bias unit configured to provide first and second bias signals to the first and second amplifier input nodes, respectively, such that the amplifier is configured to cause the first current to approximately equal the second current;
wherein the first bias unit comprises:
a first capacitor serially coupled between the first branch and the first amplifier input node; and
a second capacitor serially coupled between the second branch and the second amplifier input node.

21. A circuit, comprising:
a first branch configured to generate a first current;
a second branch configured to generate a second current;
an amplifier having a first amplifier input node coupled to the first branch, a second amplifier input node coupled to the second branch, and an amplifier output node coupled to the first and second branches; and
a first bias unit configured to provide first and second bias signals to the first and second amplifier input nodes, respectively, such that the amplifier is configured to cause the first current to approximately equal the second current;
wherein the first bias unit comprises:
a first capacitor having a first node coupled to the first branch and having a second node coupled to the first amplifier input node;
a second capacitor having a first node coupled to the second branch and having a second node coupled to the second amplifier input node; and
a bias generator configured to cause the first capacitor to store a first bias voltage and configured to cause the second capacitor to store a second bias voltage.

22. A circuit, comprising:
a first branch configured to generate a first current;
a second branch configured to generate a second current;
an amplifier having a first amplifier input node coupled to the first branch, a second amplifier input node coupled to the second branch, and an amplifier output node coupled to the first and second branches; and
a first bias unit configured to provide first and second bias signals to the first and second amplifier input nodes, respectively, such that the amplifier is configured to cause the first current to approximately equal the second current;
wherein the first bias unit comprises:
a first capacitor having a first node coupled to the first branch and having a second node coupled to the first amplifier input node;
a second capacitor having a first node coupled to the second branch and having a second node coupled to the second amplifier input node; and a bias generator configured to cause the first capacitor to store a first bias voltage and configured to cause the second capacitor to store approximately the first bias voltage.

23. A circuit, comprising:
a first branch configured to generate a first current;
a second branch configured to generate a second current;
an amplifier having a first amplifier input node coupled to the first branch, a second amplifier input node coupled to the second branch, and an amplifier output node coupled to the first and second branches; and
a first bias unit configured to provide first and second bias signals to the first and second amplifier input nodes, respectively, such that the amplifier is configured to cause the first current to approximately equal the second current;
wherein the first bias unit comprises:
a first capacitor having a first node coupled to the first branch and having a second node coupled to the first amplifier input node;
a second capacitor having a first node coupled to the second branch and having a second node coupled to the second amplifier input node; and
a bias generator configured to disable the amplifier, to cause the first capacitor to store a first bias voltage while the amplifier is disabled, and to cause the second capacitor to store approximately the first bias voltage while the amplifier is disabled.

24. A circuit, comprising:
a first branch configured to generate a first current;
a second branch configured to generate a second current;
an amplifier having a first amplifier input node coupled to the first branch, a second amplifier input node coupled to the second branch, and an amplifier output node coupled to the first and second branches; and
a first bias unit configured to provide first and second bias signals to the first and second amplifier input nodes, respectively, such that the amplifier is configured to cause the first current to approximately equal the second current;
wherein the first bias unit comprises:
a first capacitor having a first node coupled to the first branch and having a second node coupled to the first amplifier input node;
a second capacitor having a first node coupled to the second branch and having a second node coupled to the second amplifier input node; and
a bias generator configured to couple the first nodes of the first and second capacitors to a common voltage, and to couple a bias voltage to the second nodes of the first and second capacitors.

25. A circuit, comprising:
a first branch configured to generate a first current;
a second branch configured to generate a second current;
an amplifier having a first amplifier input node coupled to the first branch, a second amplifier input node coupled to the second branch, and an amplifier output node coupled to the first and second branches; and
a first bias unit configured to provide first and second bias signals to the first and second amplifier input nodes, respectively, such that the amplifier is configured to cause the first current to approximately equal the second current;
wherein the first bias unit comprises:
a first capacitor having a first node coupled to the first branch and having a second node coupled to the first amplifier input node;
a second capacitor having a first node coupled to the second branch and having a second node coupled to the second amplifier input node; and
a bias generator configured to couple the first node of the first capacitor to the first node of the second capacitor, and to couple a bias voltage to the second nodes of the first and second capacitors.

26. An integrated circuit, comprising:
a first circuit, comprising:
a first branch configured to generate a first current;
a second branch configured to generate a second current;
an amplifier having a first amplifier input node coupled to the first branch, a second amplifier input node coupled to the second branch, and an amplifier output node coupled to the first and second branches; and
a first bias unit having first and second capacitive elements coupled to the first and second branches, respectively, and configured to provide first and second bias signals to the first and second amplifier input nodes, respectively, such that the amplifier is configured to cause the first current to approximately equal the second current; and
a second circuit configured to receive a signal derived from one of the first and second currents;
wherein the first capacitive element includes a first node coupled to the first branch and a second node coupled to the first amplifier input node.

27. The integrated circuit of claim 26 wherein the signal derived from one of the first and second currents comprises a reference signal.

28. The integrated circuit of claim 26 wherein:
the second circuit is configured to receive a reference voltage as the signal derived from one of the first and second currents; and
the first circuit further comprises a reference generator configured to generate the reference voltage in response to one of the first and second currents.

29. The integrated circuit of claim 26 wherein:
the second circuit is configured to receive a reference voltage as the signal derived from one of the first and second currents;
the first and second branches are configured to generate the first and second currents approximately proportional to temperature; and
the first circuit further comprises a reference generator configured to generate the reference voltage approximately independent of temperature in response to one of the first and second currents.

30. A system, comprising:
a first integrated circuit, comprising:
a first circuit, comprising:
a first branch configured to generate a first current;
a second branch configured to generate a second current;
an amplifier having a first amplifier input node coupled to the first branch, a second amplifier input node coupled to the second branch, and an amplifier output node coupled to the first and second branches; and
a first bias unit having first and second capacitive-elements coupled to the first and second branches and configured to provide first and second bias signals to the first and second amplifier input nodes, respectively, such that the amplifier is configured to cause the first current to approximately equal the second current; and
a second circuit configured to receive a signal derived from one of the first and second currents; and
a second integrated circuit coupled to the first integrated circuit;

wherein the first capacitive element includes a first node coupled to the first branch and a second node coupled to the first amplifier input node.

31. The system of claim 30 wherein one of the first and second integrated circuits comprises a processor.

32. The system of claim 30 wherein the first and second integrated circuits are disposed on a same die.

33. The system of claim 30 wherein the first and second integrated circuits are disposed on respective dies.

34. A method, comprising:
generating first and second currents in response to an amplifier;
filtering the first and second currents with respective first and seconds capacitors, each having first nodes respectively coupled to first and second input nodes of the amplifier and each having second nodes respectively coupled to nodes for the first and second currents; and
biasing the input nodes of the amplifier such that the amplifier causes the first current to approximately equal the second current.

35. The method of claim 34 wherein generating the first and second currents comprises:
generating the first current in response to a first base-emitter voltage; and
generating the second current in response to a second base-emitter voltage.

36. The method of claim 34 wherein generating the first and second currents comprises generating each of the first and second currents proportional to a difference between two base emitter voltages.

37. The method of claim 34 wherein biasing the amplifier input nodes comprises superimposing a bias signal on an input signal to one of the amplifier input nodes.

38. The method of claim 34 wherein biasing the amplifier input nodes comprises:
superimposing a first bias signal on a first input signal to a first one of the input nodes; and
superimposing a second bias signal on a second input signal to a second one of the input nodes.

39. The method of claim 34 wherein biasing the amplifier input nodes comprises:
superimposing a first bias signal on a first input signal to a first one of the input nodes; and
superimposing a second bias signal on a second input signal to a second one of the input nodes, the second bias signal approximately equal to the first bias signal.

40. The method of claim 34 wherein biasing the amplifier input nodes comprises:
superimposing a first bias voltage on a first input voltage to a first one of the input nodes; and
superimposing a second bias voltage on a second input voltage to a second one of the input nodes.

41. The method of claim 34 wherein biasing the input nodes comprises biasing the input nodes such that a transistor of the amplifier operates in a region where a current conducted by the transistor is relatively independent of a voltage across conduction nodes of the transistor.

42. The method of claim 34 wherein biasing the input nodes comprises biasing the input nodes such that a transistor of the amplifier has a relatively high output impedance.

43. The method of claim 34 wherein generating the first and second currents comprises generating the first and second currents proportional to temperature.

44. The method of claim 34 wherein generating the first and second currents comprises generating the first and second currents proportional to absolute temperature.

45. The method of claim 34, further comprising generating a band-gap reference voltage in response to one of the first and second currents.

46. A method, comprising:
generating first and second currents in response to an amplifier; and
biasing input nodes of the amplifier such that the amplifier causes the first current to approximately equal the second current;
wherein biasing the input nodes of the amplifier comprises:
rendering the amplifier unable to cause the first current to approximately equal the second current; and
generating a bias signal for one of the amplifier input nodes while rendering the amplifier unable to cause the first current to approximately equal the second current.

47. A method, comprising:
generating first and second currents in response to an amplifier; and
biasing input nodes of the amplifier such that the amplifier causes the first current to approximately equal the second current;
wherein biasing the input nodes of the amplifier comprises:
rendering the amplifier unable to cause the first current to approximately equal the second current;
generating a bias signal for one of the amplifier input nodes while rendering the amplifier unable to cause the first current to approximately equal the second current;
storing the bias signal;
rendering the amplifier able to cause the first current to approximately equal the second current; and
superimposing the stored bias signal on an input signal to the one of the input nodes while rendering the amplifier able to cause the first current to approximately equal the second current.

48. A method, comprising:
generating first and second currents in response to an amplifier; and
biasing input nodes of the amplifier such that the amplifier causes the first current to approximately equal the second current;
wherein biasing the input nodes of the amplifier comprises:
rendering the amplifier unable to cause the first current to approximately equal the second current;
causing the first current to approximately equal the second current with a circuit other than the amplifier while rendering the amplifier unable to cause the first current to approximately equal the second current;
generating a bias signal for one of the amplifier input nodes while rendering the amplifier unable to cause the first current to approximately equal the second current;
storing the bias signal;
rendering the amplifier able to cause the first current to approximately equal the second current; and
superimposing the stored bias signal on an input signal to the one of the input nodes while rendering the amplifier able to cause the first current to approximately equal the second current.

* * * * *